(12) United States Patent
Liu et al.

(10) Patent No.: US 12,094,804 B2
(45) Date of Patent: Sep. 17, 2024

(54) METHOD OF MANUFACTURING A SEMICONDUCTOR DEVICE AND A SEMICONDUCTOR DEVICE

(71) Applicant: CHANGXIN MEMORY TECHNOLOGIES, INC., Hefei (CN)

(72) Inventors: Jie Liu, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 348 days.

(21) Appl. No.: 17/454,877

(22) Filed: Nov. 15, 2021

(65) Prior Publication Data
US 2023/0005817 A1    Jan. 5, 2023

Related U.S. Application Data

(63) Continuation of application No. PCT/CN2021/106494, filed on Jul. 15, 2021.

(30) Foreign Application Priority Data

Jul. 1, 2021  (CN) .......................... 202110750950.6

(51) Int. Cl.
*H01L 23/48*  (2006.01)
*H01L 21/768*  (2006.01)

(52) U.S. Cl.
CPC ...... *H01L 23/481* (2013.01); *H01L 21/76846* (2013.01); *H01L 21/76898* (2013.01)

(58) Field of Classification Search
CPC ....... H01L 23/00; H01L 23/48; H01L 23/481; H01L 23/532; H01L 23/53295;
(Continued)

(56) References Cited

U.S. PATENT DOCUMENTS 8,466,062 B2  6/2013  Lu et al.
8,859,425 B2  10/2014  Kirby et al.
(Continued)

FOREIGN PATENT DOCUMENTS

CN    104854694 A    8/2015
KR    20080090826 A   10/2008

OTHER PUBLICATIONS

International Search Report cited in PCT/CN2021/106494, mailed Mar. 28, 2022, 8 pages.

*Primary Examiner* — Chuong A Luu
(74) *Attorney, Agent, or Firm* — Kilpatrick Townsend & Stockton LLP

(57) ABSTRACT

The present disclosure provides a method of manufacturing a semiconductor device and a semiconductor device. The method of manufacturing a semiconductor device includes: providing a substrate with trenches, and the trenches extending along a thickness direction of the substrate from a first surface of the substrate; forming a first auxiliary layer and a first conductive layer successively in the trenches, and the first conductive layer covering the first auxiliary layer; thinning the substrate on a second surface of the substrate to expose the first auxiliary layer; removing the first auxiliary layer to form first openings; forming a second medium layer on the second surface of the substrate; patterning the second medium layer to form second openings in the second medium layer, and the second openings exposing the first openings; and depositing a second initial conductive layer, the second initial conductive layer filling the first openings and the second openings.

15 Claims, 17 Drawing Sheets

(58) Field of Classification Search
CPC ............. H01L 21/768; H01L 21/76846; H01L 21/76877; H01L 21/76865; H01L 21/76847; H01L 21/76898
USPC .................. 257/774; 438/637, 672, 675, 700
See application file for complete search history.

(56) References Cited

U.S. PATENT DOCUMENTS

| | | | |
|---|---|---|---|
| 2005/0224961 A1* | 10/2005 | Farquhar | H05K 3/4608 257/723 |
| 2007/0037349 A1* | 2/2007 | Gutsche | H01L 28/90 438/253 |
| 2011/0061906 A1* | 3/2011 | Cho | H05K 1/0271 174/257 |
| 2012/0315752 A1* | 12/2012 | Chung | H01L 21/76883 257/E21.159 |
| 2013/0105968 A1* | 5/2013 | Lu | H01L 24/05 257/737 |
| 2013/0119543 A1 | 5/2013 | Yu et al. | |
| 2013/0175673 A1 | 7/2013 | Jin et al. | |

* cited by examiner

METHOD OF MANUFACTURING A SEMICONDUCTOR DEVICE AND A SEMICONDUCTOR DEVICE

CROSS-REFERENCE TO RELATED APPLICATIONS

The present disclosure is a continuation application of International Patent Application No. PCT/CN2021/106494, titled "A METHOD OF MANUFACTURING A SEMICONDUCTOR DEVICE AND A SEMICONDUCTOR DEVICE" and filed on Jul. 15, 2021, which claims the priority to Chinese Patent Application No. 202110750950.6, titled "A METHOD OF MANUFACTURING A SEMICONDUCTOR DEVICE AND A SEMICONDUCTOR DEVICE" and filed with China National Intellectual Property Administration (CNIPA) on Jul. 1, 2021. The entire contents of International Patent Application No. PCT/CN2021/106494 and Chinese Patent Application No. 202110750950.6 are incorporated herein by reference.

TECHNICAL FIELD

The present disclosure relates to, but is not limited to, a method of manufacturing a semiconductor device and a semiconductor device.

BACKGROUND

Through silicon vias (TSV) technology can realize the interconnection between chips with the shortest distance and the smallest spacing, so as to achieve better electrical performance.

However, in related technologies, in manufacturing process of TSV, it is usually ground to expose the copper layer. In this process, silicon and copper materials need to be ground at the same time. The silicon material is brittle and easy to crack. In the case of high temperature and electric field, copper material is easy to diffuse in semiconductor silicon wafer, and the phenomenon of copper contamination on the silicon layer surface or cracks is easy to appear, resulting in low yield.

SUMMARY

According to the technical solutions of the first aspect of the present disclosure, a method of manufacturing a semiconductor device is provided, comprising: providing a substrate with trenches, and the trenches extending along a thickness direction of the substrate from a first surface of the substrate; forming a first auxiliary layer and a first conductive layer successively in the trenches, and the first conductive layer covering the first auxiliary layer; thinning the substrate on a second surface of the substrate to expose the first auxiliary layer, wherein the first surface and the second surface are arranged opposite to each other; removing the first auxiliary layer to form first openings; forming a second medium layer on the second surface of the substrate; patterning the second medium layer to form second openings in the second medium layer, and the second openings exposing the first openings; and depositing a second initial conductive layer, the second initial conductive layer filling the first openings and the second openings.

The technical solutions of the second aspect of the present disclosure provides a semiconductor device, comprising: a substrate, the substrate having a first surface and a second surface, the first surface and the second surface are arranged opposite to each other; at least one through hole, penetrating the substrate along a thickness direction of the substrate; a first conductive layer and a second conductive layer filled in the through holes and filled with the through holes, and the first conductive layer and the second conductive layer in the same through holes being connected; a top surface of the first conductive layer is flush with the first surface of the substrate.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these drawings, similar reference numerals are used to indicate similar elements. The drawings in the following description are some embodiments of the present disclosure, but not all embodiments. For those skilled in the art, other drawings can be obtained from these drawings without any creative efforts.

One or more embodiments are exemplified by pictures in the corresponding drawings. These exemplary descriptions do not constitute a limitation on the embodiments. Elements with the same reference numerals in the drawings represent similar elements. Unless otherwise stated, the figures in the drawings do not constitute a limitation on scale.

DETAILED DESCRIPTION

In the following, only some exemplary embodiments are briefly described. As those skilled in the art can recognize, the described embodiments may be modified in various ways without departing from the spirit or scope of the present disclosure. Therefore, the drawings and descriptions are considered to be exemplary rather than restrictive in nature.

At present, through silicon vias (TSV) technology can realize the interconnection between chips with the shortest distance and the smallest spacing, so as to achieve better electrical performance.

However, in related technologies, in manufacturing process of TSV, it is usually ground to expose the copper layer. In this process, silicon and copper materials need to be ground at the same time. The silicon material is brittle and easy to crack. In the case of high temperature and electric field, copper material is easy to diffuse in semiconductor silicon wafer, and the phenomenon of copper contamination on the silicon layer surface or cracks is easy to appear, resulting in low yield.

In view of this, the present disclosure provides a method of manufacturing a semiconductor device, which can not only reduce the processing steps, but also improve the yield of the semiconductor device.

Figure 1:
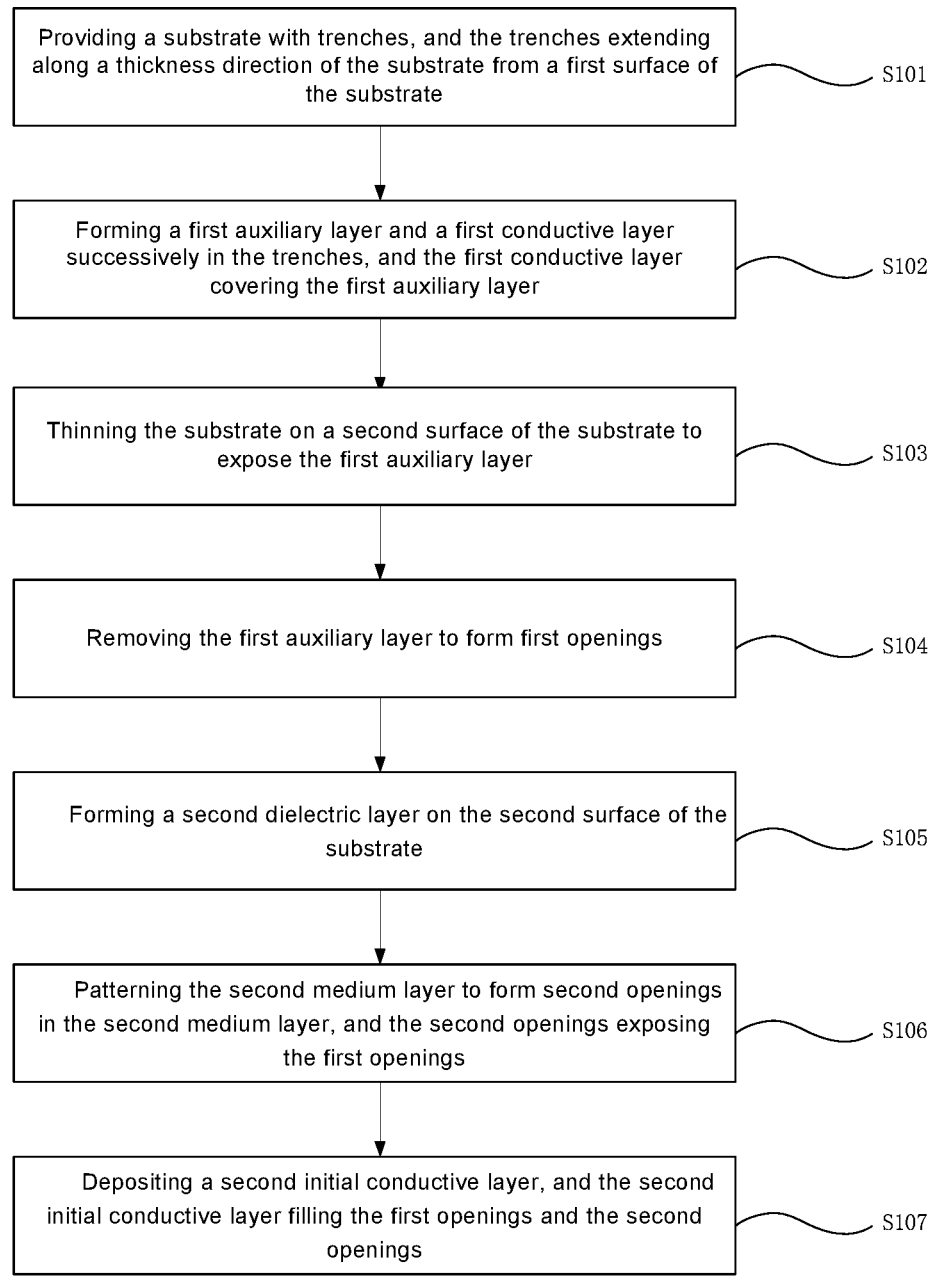
FIG. 1 is a flowchart showing a method of manufacturing a semiconductor device according to an exemplary embodiment.

Referring to FIG. 1, the method of manufacturing a semiconductor device provided by the embodiment of the present disclosure includes:

S101: providing a substrate with trenches, and the trenches extending along a thickness direction of the substrate from a first surface of the substrate;

S102: forming a first auxiliary layer and a first conductive layer successively in the trenches, and the first conductive layer covering the first auxiliary layer;

S103: thinning the substrate on a second surface of the substrate to expose the first auxiliary layer, wherein the first surface and the second surface are arranged opposite to each other;

S104: removing the first auxiliary layer to form first openings;

S105: forming a second medium layer on the second surface of the substrate;

S106: patterning the second medium layer to form second openings in the second medium layer, and the second openings exposing the first openings; and S107: depositing a second initial conductive layer, and the second initial conductive layer filling the first openings and the second openings.

Figure 9:
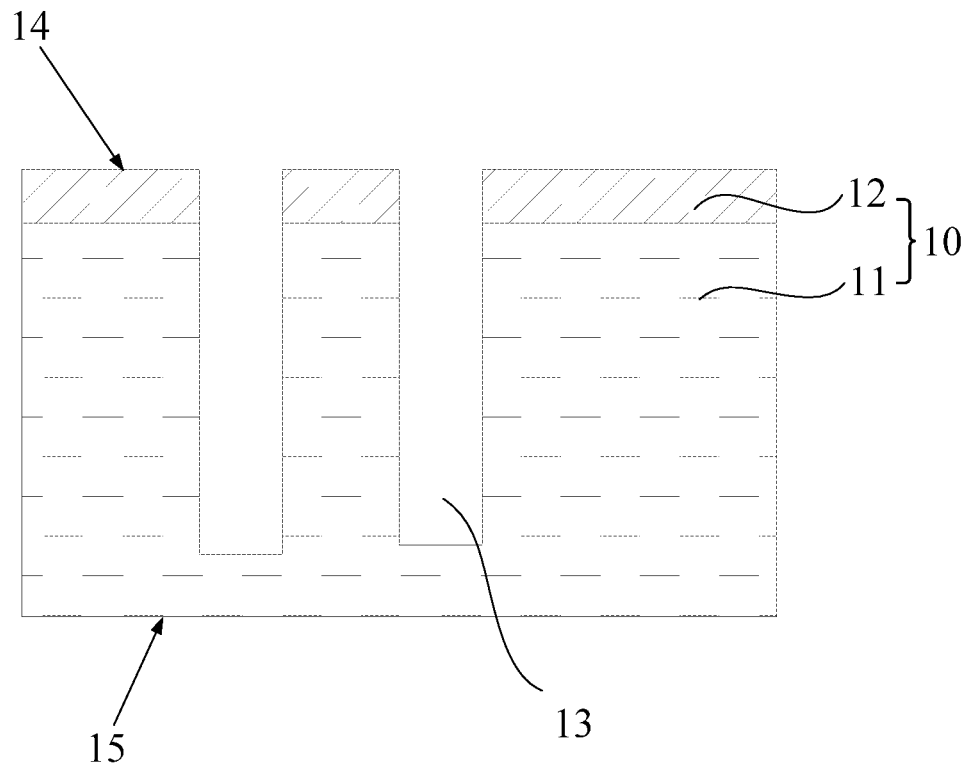

In step 101, as shown in FIG. 9, the trenches 13 on the substrate 10 are non-penetrating trenches formed on the first surface 14 of the substrate 10, that is, there are certain distances between the bottom surfaces of the trenches 13 and the second surface 15 of the substrate 10. The trenches 13 extend along the thickness direction of the substrate 10 from the first surface 14 of the substrate 10, so that the bottom surfaces of the trenches 13 are close to the second surface 15 of the substrate 10, and the first surface 14 and the second surface 15 are arranged opposite to each other.

The number of trenches 13 on the substrate 10 is not specifically limited, and may be one, two or more. Taking the plane parallel to the substrate 10 as the cross section, cross-sectional shapes of the trenches 13 include, but are not limited to, circular, rectangular and diamond.

A variety of active devices (for example, transistors, diodes, etc.) may be arranged on the first surface 14 of the substrate 10, and various electrical interconnection structures may also be formed between the active devices.

Figure 12:
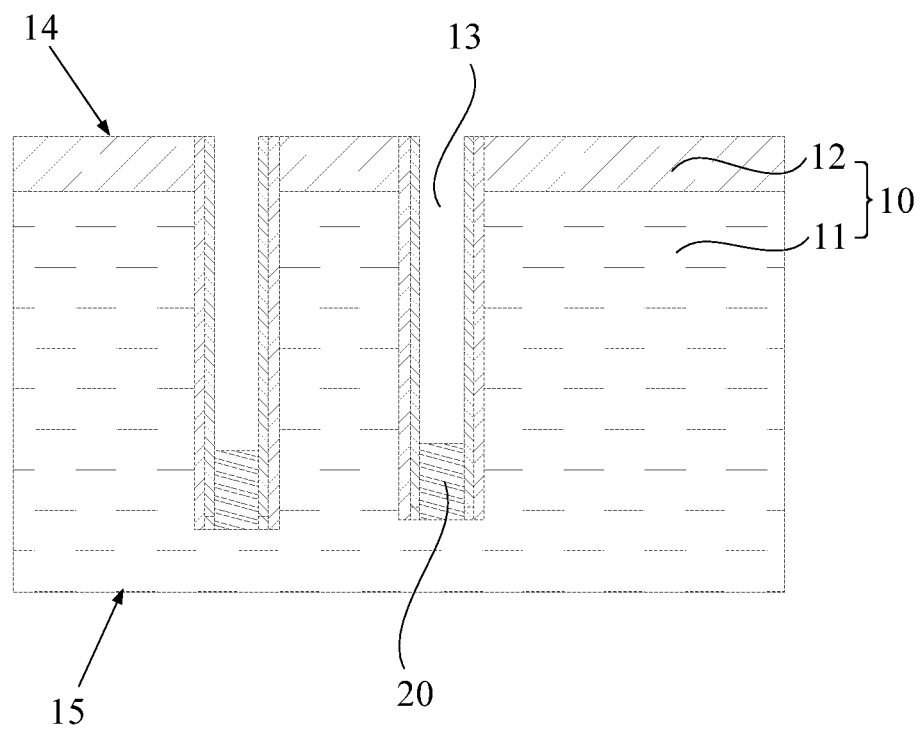
Figure 13:
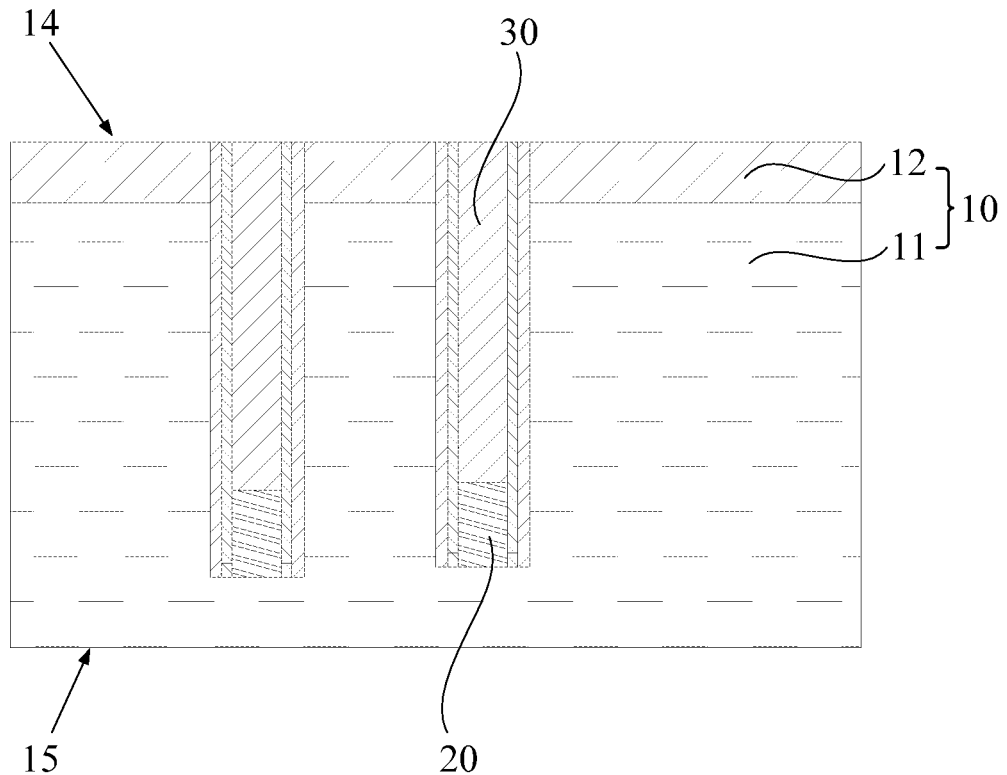

In step 102, as shown in FIGS. 12 and 13, a first auxiliary layer 20 is first deposited in the trenches 13 so that the first auxiliary layer 20 covers the bottom surfaces of the trenches 13, and the first auxiliary layer 20 has a certain thickness. Then, a first conductive layer 30 is deposited above the first auxiliary layer 20 so that the first conductive layer 30 covers the first auxiliary layer 20. That is, the first auxiliary layer 20 is located at the bottoms of the trenches 13, and the first auxiliary layer 20 is located on the side close to the second surface 15 relative to the first conductive layer 30. The material of the first conductive layer 30 can be a material with good conductivity, such as silver, copper, aluminum, etc.

In this embodiment, the first auxiliary layer 20 and the first conductive layer 30 may directly contact and connected with side wall surfaces of the trenches 13, that is, no other structures are arranged between the first auxiliary layer 20 and side wall surfaces of the trenches 13 and between the first conductive layer 30 and side wall surfaces of the trenches 13. Of course, it can be understood that in other embodiments, other structures such as barrier layer may be provided between the first auxiliary layer 20 and side wall surfaces of the trenches 13 and between the first conductive layer 30 and side wall surfaces of the trenches 13.

In this embodiment, when there are two or more trenches 13 on the substrate 10, the depths of different trenches 13 may be different. However, the distance between the contact surface of the first conductive layer 30 and the first auxiliary layer 20 in any trench 13 and the first surface 14 of the substrate 10 is smaller than the depths of any other trenches 13 to avoid grinding to the first conductive layer 30 when performing step S103, that is, thinning the substrate 10 on the second surface 15 of the substrate 10.

Figure 14:
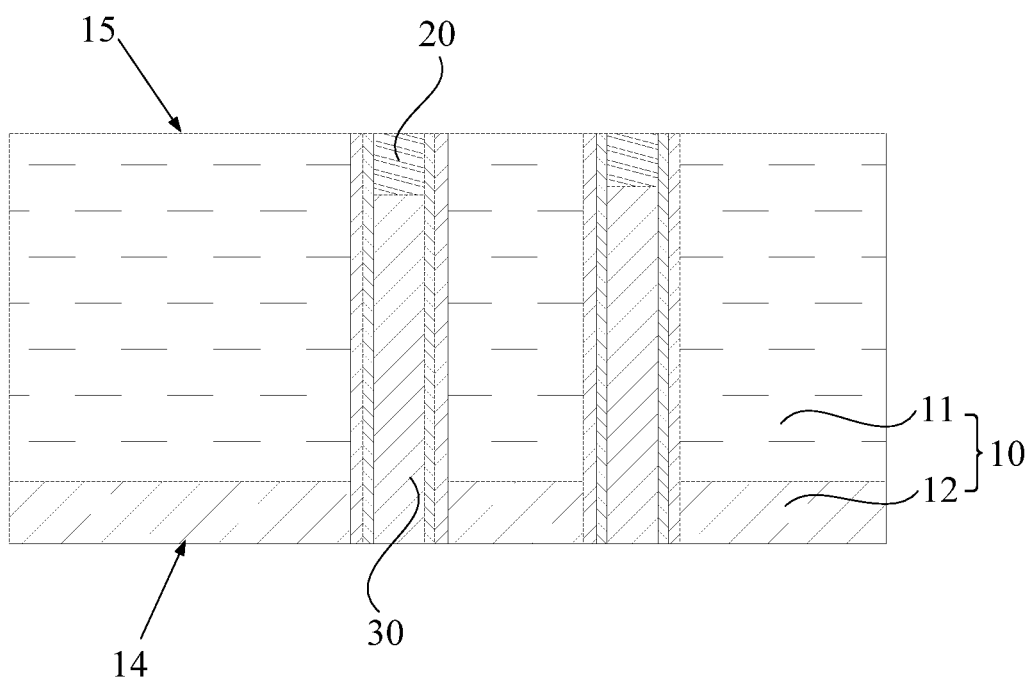

In step 103, as shown in FIG. 14, a method of grinding the second surface 15 of the substrate 10 may be used to thin the substrate 10 until the first auxiliary layer 20 is exposed. Then, the top surface of the first auxiliary layer 20 is flush with the second surface 15, and the surface of the first conductive layer 30 is flush with the first surface 14. The trenches 13 form openings on both the first surface 14 and the second surface 15, so that the trenches 13 form through holes penetrating the first surface 14 and the second surface 15 of the substrate 10. During the grinding process of thinning the substrate 10, part of the material of the substrate 10 close to the second surface 15 and part of the first auxiliary layer 20 are ground away at the same time, so as to avoid grinding to the first conductive layer 30. When the material of the first auxiliary layer 20 is non-metallic material (such as silicon dioxide or silicon nitride, etc.), on the one hand, there is no case that the metal material contaminates the second surface of the substrate 10; on the other hand, the ductility of the non-metallic material is weaker than the ductility of the metallic material, and the ductility of the first auxiliary layer 20 is more similar to the ductility of the substrate 10. When part of the material of the substrate 10 and part of the first auxiliary layer 20 are ground away at the same time, the deformation of the first auxiliary layer 20 in the radial direction is very small, so that the extrusion of the first auxiliary layer 20 on the substrate 10 in the radial direction is small, and the probability of cracks on the second surface 15 of the substrate 10 is reduced, thereby improving the yield of TSV. In order to avoid contamination of the second surface 15 by metals and cracks on the second surface 15, the material of the first auxiliary layer 20 includes, but is not limited to, non-metallic materials such as silicon dioxide or silicon nitride.

In addition, the material of the first auxiliary layer 20 in this embodiment can be not only non-metallic material, but also metal material with low ductility, which can reduce the probability of metal contaminating the second surface 15 or cracks on the second surface 15.

Figure 15:
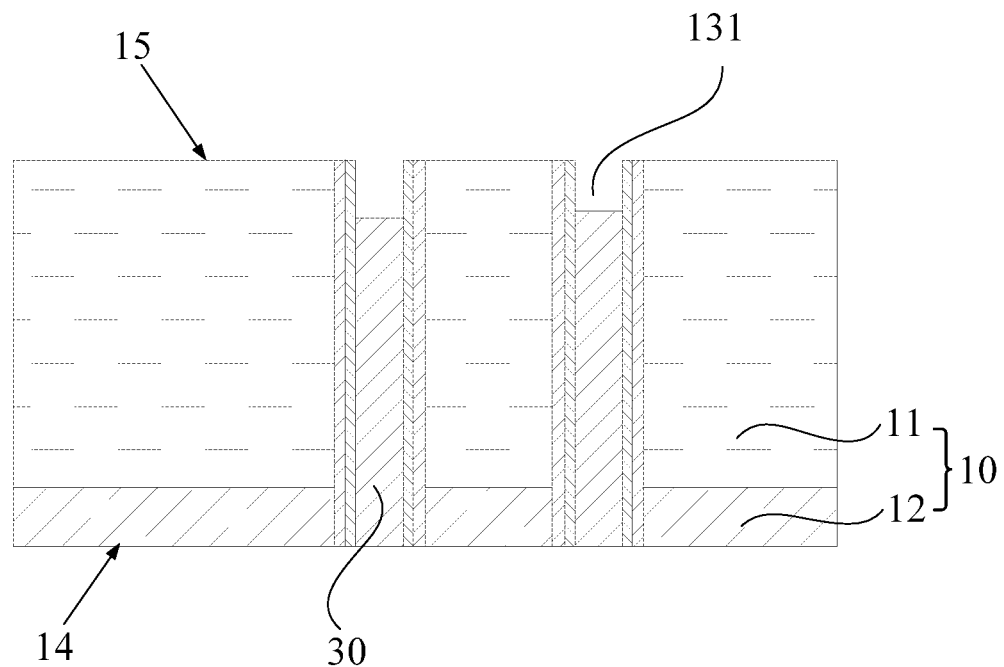

In step 104, referring to FIGS. 12, 14 and 15, the first auxiliary layer 20 may be removed by etching process so that first openings 131 are formed at ends of the trenches 13 towards the second surface 15 to expose the first conductive layer 30 in the trenches 13.

The etching process can be wet etching, dry etching, deep reactive ion etching, laser etching, etc.

Figure 16:
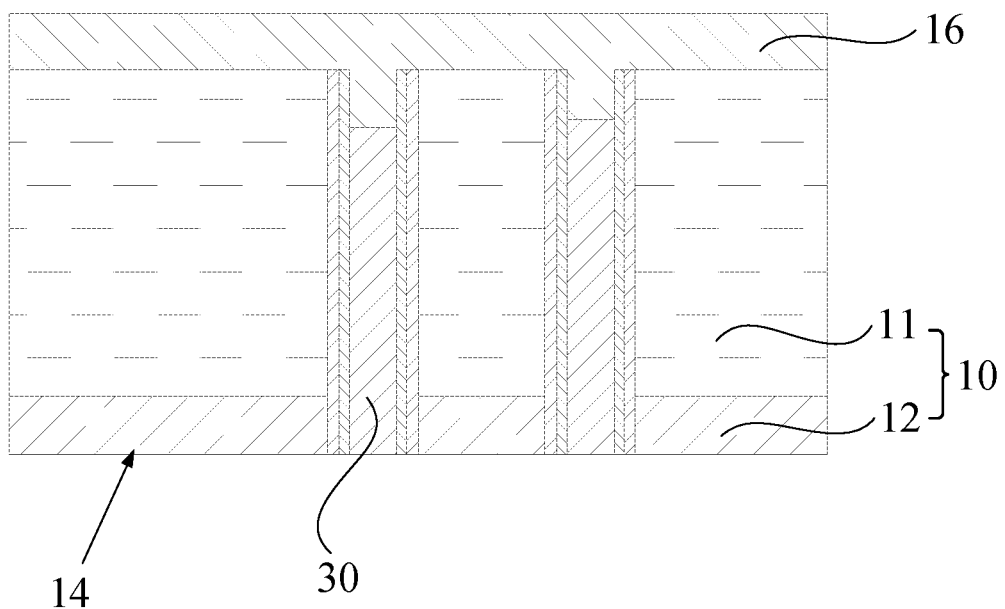
Figure 18:
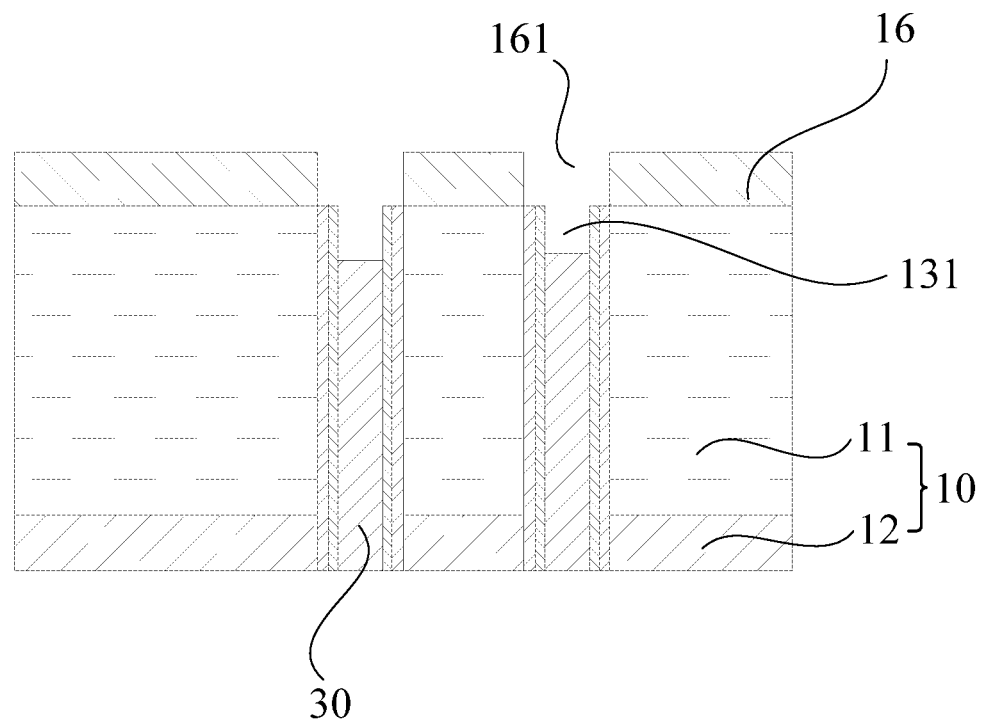
Figure 19:
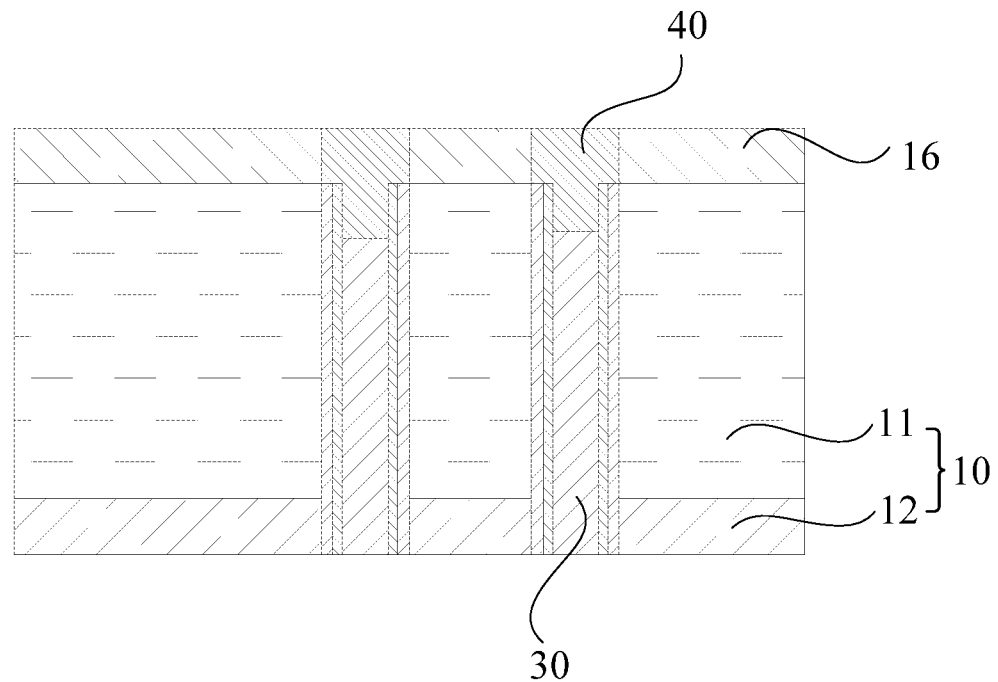

In steps 105, 106 and S107, as shown in FIG. 16, FIG. 18 and FIG. 19, and refer to FIG. 15. Referring to FIG. 16, a second medium layer 16 is formed on the second surface 15 of the substrate 10, wherein the material of the second medium layer 16 may be silica, and the second medium layer 16 covers the second surface 15 and the first openings 131 of the substrate 10. Referring to FIG. 18, the second medium layer 16 is patterned so that second openings 161 exposing the first openings 131 are formed on the second medium layer 16. Referring to FIG. 19, a second initial conductive layer 40 is finally deposited to fill the first openings 131 and the second openings 161, and the first conductive layer 30 and the second initial conductive layer 40 are connected as a whole to form a TSV for conduction on the substrate 10, so that a plurality of semiconductor devices (such as chips) can be stacked in a vertical plane direction to save space. The materials of the second initial conductive layer 40 include, but are not limited to, silver, copper and aluminum. The materials of the second initial conductive layer 40 and the first conductive layer 30 may be the same or different.

Figure 17:
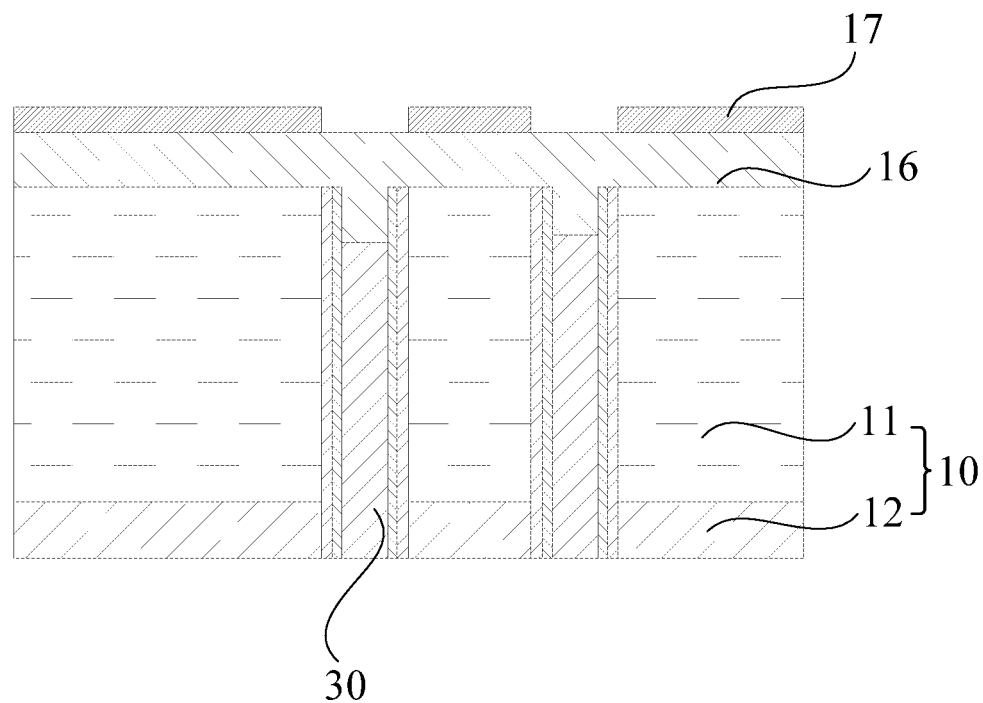

As shown in FIG. 17, when patterning the second medium layer 16, a mask layer 17 is first formed on the second medium layer 16, and the geometric patterns are depicted on the mask layer 17 by exposure and development, and then, the patterns on the mask layer 17 is transferred to the second medium layer 16 through the etching process, so as to form second openings 161. The material of the second initial conductive layer 40 is preferably a material with good conductivity, such as silver, copper, aluminum, etc. The purpose of forming the second medium layer 16 on the second surface 15 is that the second initial conductive layer 40 is formed on the surface of the second medium layer 16 and in the first openings 131 and the second openings 161 during the process of depositing the second initial conductive layer 40 to prevent the metal material from contaminating the second surface 15 of the substrate 10 and the cracks on the second surface 15.

Figure 2:
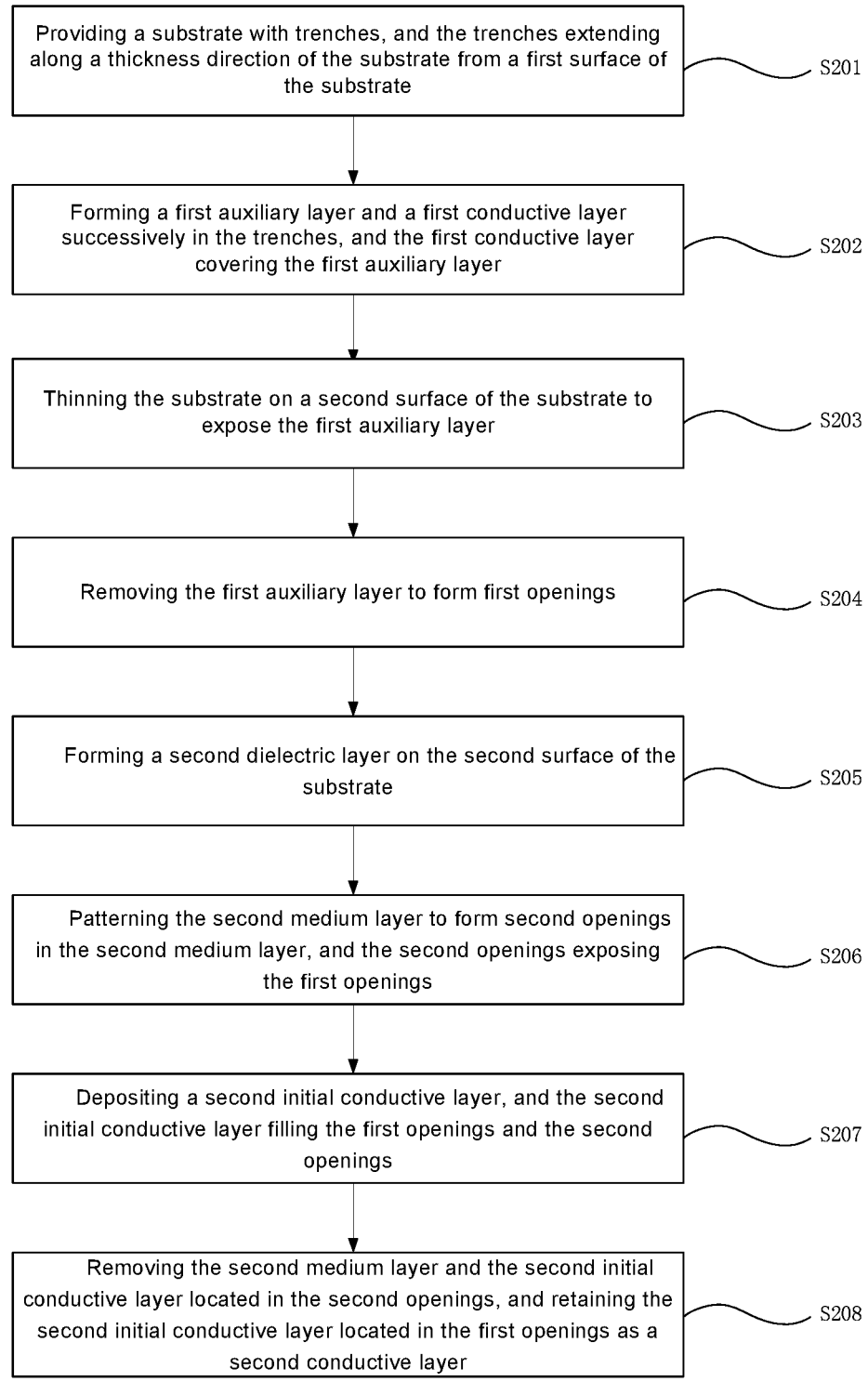
FIG. 2 is a flowchart showing a method of manufacturing a semiconductor device according to an exemplary embodiment.

Referring to FIG. 2, in an exemplary embodiment, a method of manufacturing a semiconductor device is provided. The method of manufacturing a semiconductor device comprises:

S201: providing a substrate with trenches, and the trenches extending along a thickness direction of the substrate from a first surface of the substrate;

S202: forming a first auxiliary layer and a first conductive layer successively in the trenches, and the first conductive layer covering the first auxiliary layer;

S203: thinning the substrate on a second surface of the substrate to expose the first auxiliary layer, wherein the first surface and the second surface are arranged opposite to each other;

S204: removing the first auxiliary layer to form first openings;

S205: forming a second dielectric layer on the second surface of the substrate;

S206: patterning the second medium layer to form second openings in the second medium layer, and the second openings exposing the first openings;

S207: depositing a second initial conductive layer, and the second initial conductive layer filling the first openings and the second openings; and S208: removing the second medium layer and the second initial conductive layer located in the second openings, and retaining the second initial conductive layer located in the first openings as a second conductive layer.

Figure 20:
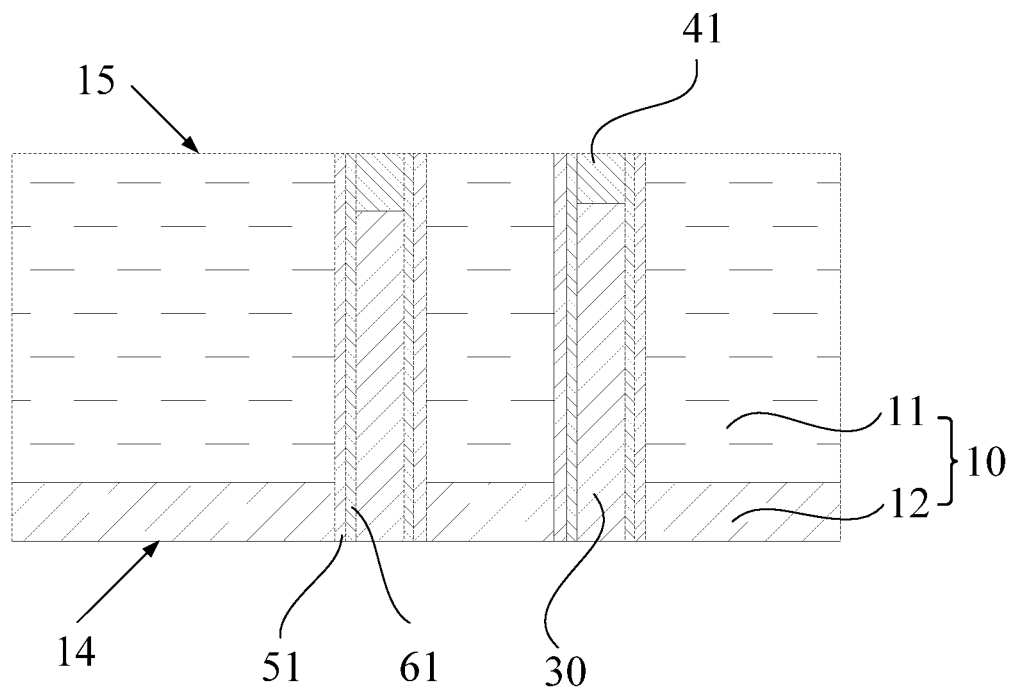
Figure 21:
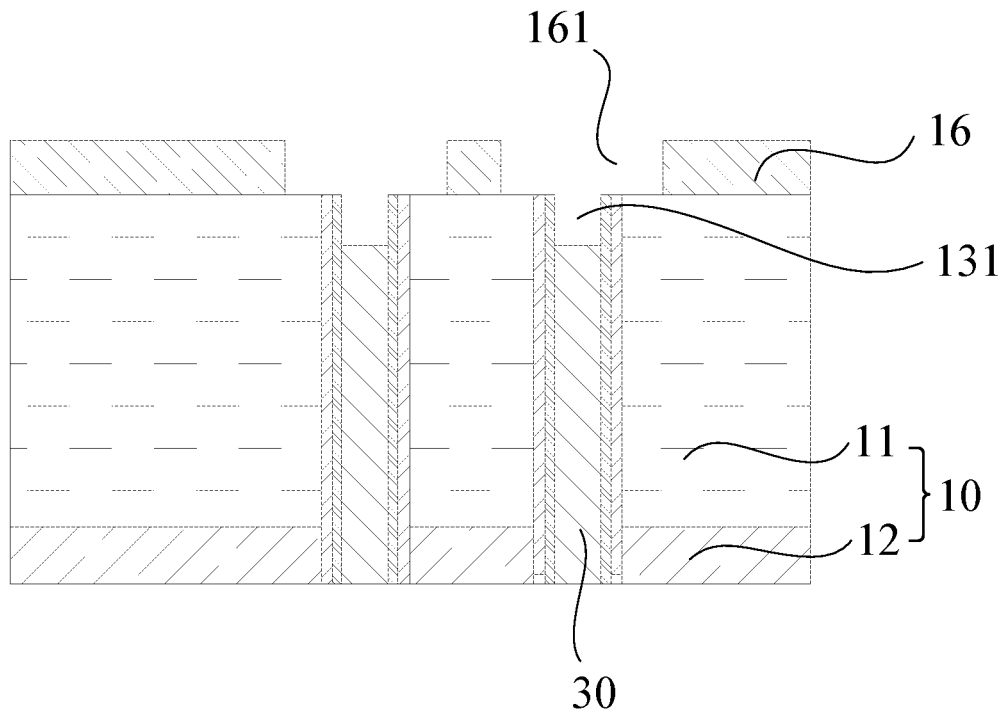

In this embodiment, the implementations of step S201 to step S207 are the same as the steps in the above embodiment, and will not be repeated here. In step S208 of the present embodiment, as shown in FIG. 20 and referring to FIGS. 18 and 19, the second medium layer 16 and the second initial conductive layer 40 located in the second openings 161 are removed, and the second initial conductive layer 40 located in the first openings 131 is retained as the second conductive layer 41, so that the surface of the second conductive layer 41 is flush with the second surface 15. At this time, the first conductive layer 30 and the second conductive layer 41 form a connected whole, and the first conductive layer 30 and the second conductive layer 41 are all made of materials with good conductivity, such as silver, copper, aluminum, etc., so that the first conductive layer 30 and the second conductive layer 41 form a conductive TSV structure of a semiconductor device. The first conductive layer 30 and the second conductive layer 41 serve as electrical connection structures between each adjacent two semiconductor devices when a plurality of semiconductor devices are stacked in a vertical plane direction.

The top surface of the second conductive layer 41 formed in this embodiment is flush with the second surface 15, and the devices connected with the second conductive layer 41 can be directly arranged on the substrate 10, and contacted and connected with the second conductive layer 41.

Figure 3:
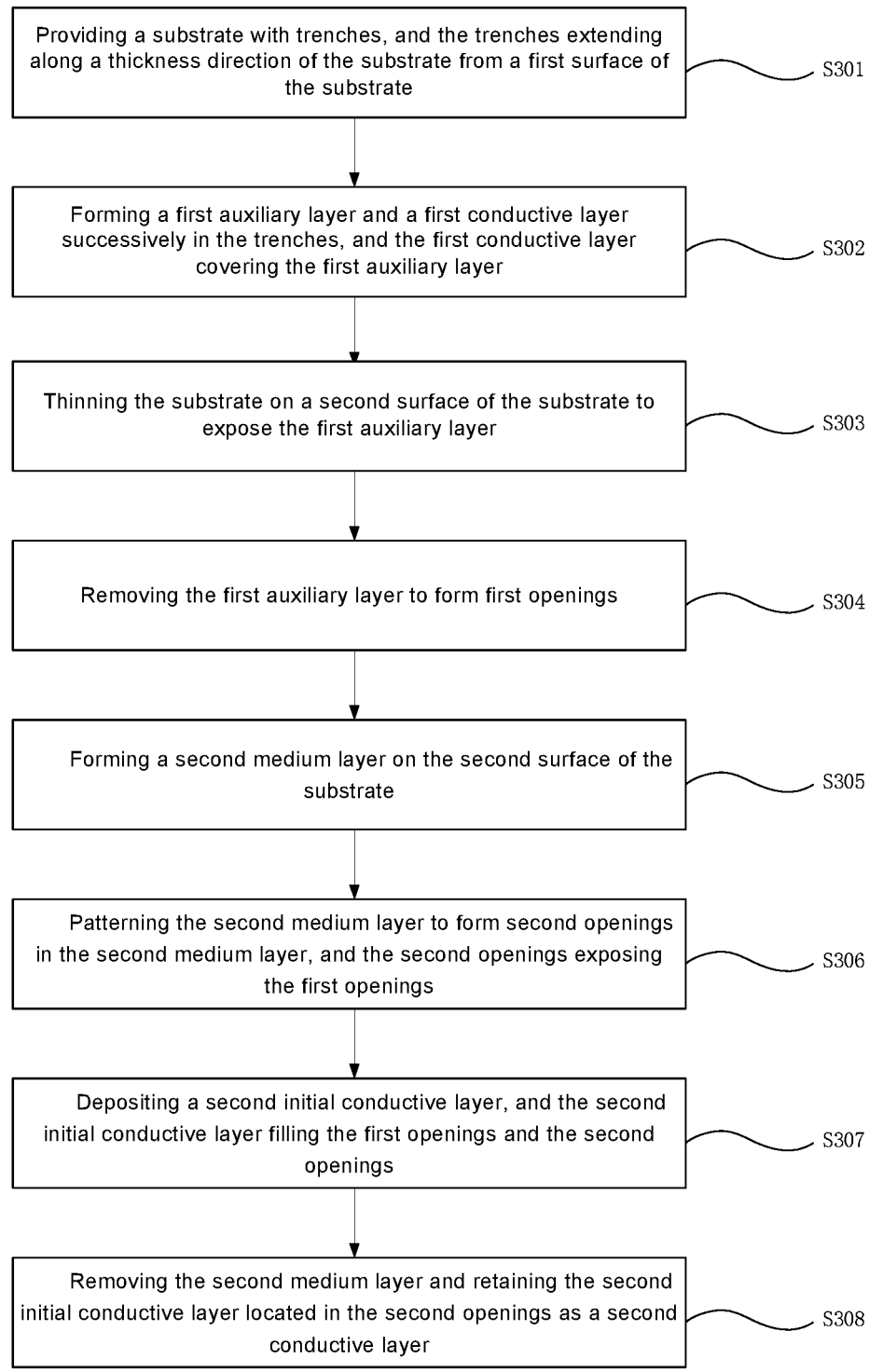
FIG. 3 is a flowchart showing a method of manufacturing a semiconductor device according to an exemplary embodiment.

Referring to FIG. 3, in an exemplary embodiment, a method of manufacturing a semiconductor device is provided. The method of manufacturing a semiconductor device comprises:

S301: providing a substrate with trenches, and the trenches extending along a thickness direction of the substrate from a first surface of the substrate;

S302: forming a first auxiliary layer and a first conductive layer successively in the trenches, and the first conductive layer covering the first auxiliary layer;

S303: thinning the substrate on a second surface of the substrate to expose the first auxiliary layer, wherein the first surface and the second surface are arranged opposite to each other;

S304: removing the first auxiliary layer to form first openings;

S305: forming a second medium layer on the second surface of the substrate;

S306: patterning the second medium layer to form second openings in the second medium layer, and the second openings exposing the first openings;

S307: depositing a second initial conductive layer, and the second initial conductive layer filling the first openings and the second openings; and S308: removing the second medium layer and retaining the second initial conductive layer located in the second openings as a second conductive layer.

Figure 24:
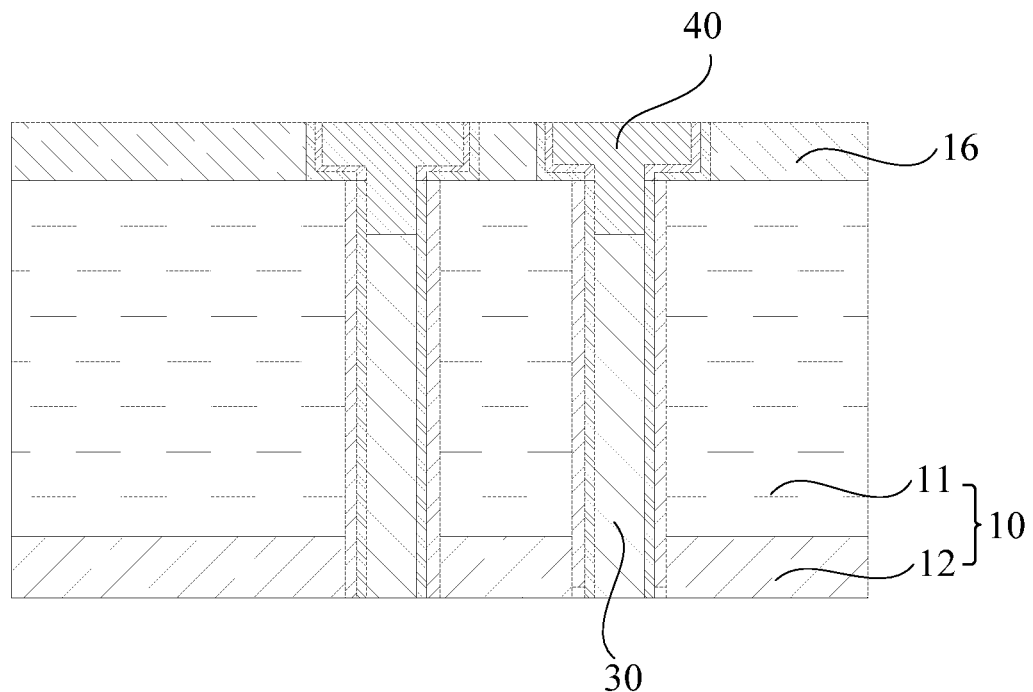
Figure 25:
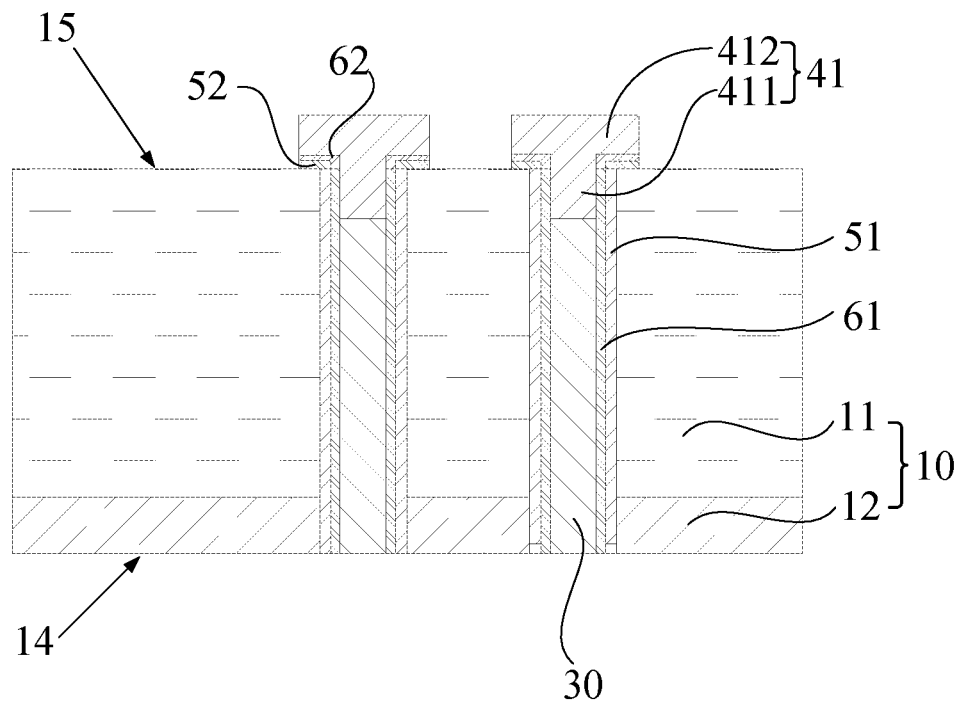

In this embodiment, the implementations of step S301 to step S307 are the same as the steps in the above embodiment, and will not be repeated here. In step S308, as shown in FIG. 25 and referring to FIG. 24, the second medium layer 16 is removed and the second initial conductive layer 40 located in the second openings 161 are retained as the second conductive layer 41, so that the second conductive layer 41 protrude from the second surface 15 to form a bump structure. The first conductive layer 30 and the second conductive layer 41 form a connected whole, and the first conductive layer 30 and the second conductive layer 41 are all made of materials with good conductivity, such as silver, copper, aluminum, etc., so that the first conductive layer 30 and the second conductive layer 41 form a conductive TSV structure of a semiconductor device. The first conductive layer 30 and the second conductive layer 41 serve as electrical connection between each adjacent two semiconductor devices when a plurality of semiconductor devices are stacked in a vertical plane direction, wherein the second conductive layer 41 forms a bump structure on the second surface 15 to facilitate the electrical connection between the adjacent two semiconductor devices.

In this embodiment, the material of the first conductive layer 30 and the material of the second conductive layer 41 may be the same or different. In other possible embodiments, the coefficient of thermal expansion of the second conductive layer 41 is less than the coefficient of thermal expansion of the first conductive layer 30 to reduce the stress on the substrate 10 in the case of heat treatment.

In this embodiment, the second conductive layer 41 is a bump structure protruding from the second surface 15, the projection of the second conductive layer 41 on the substrate 10 covers the first conductive layer 30, and the projection contour of the second conductive layer 41 on the substrate 10 is greater than the projection contour of the first conductive layer 30.

Figure 4:
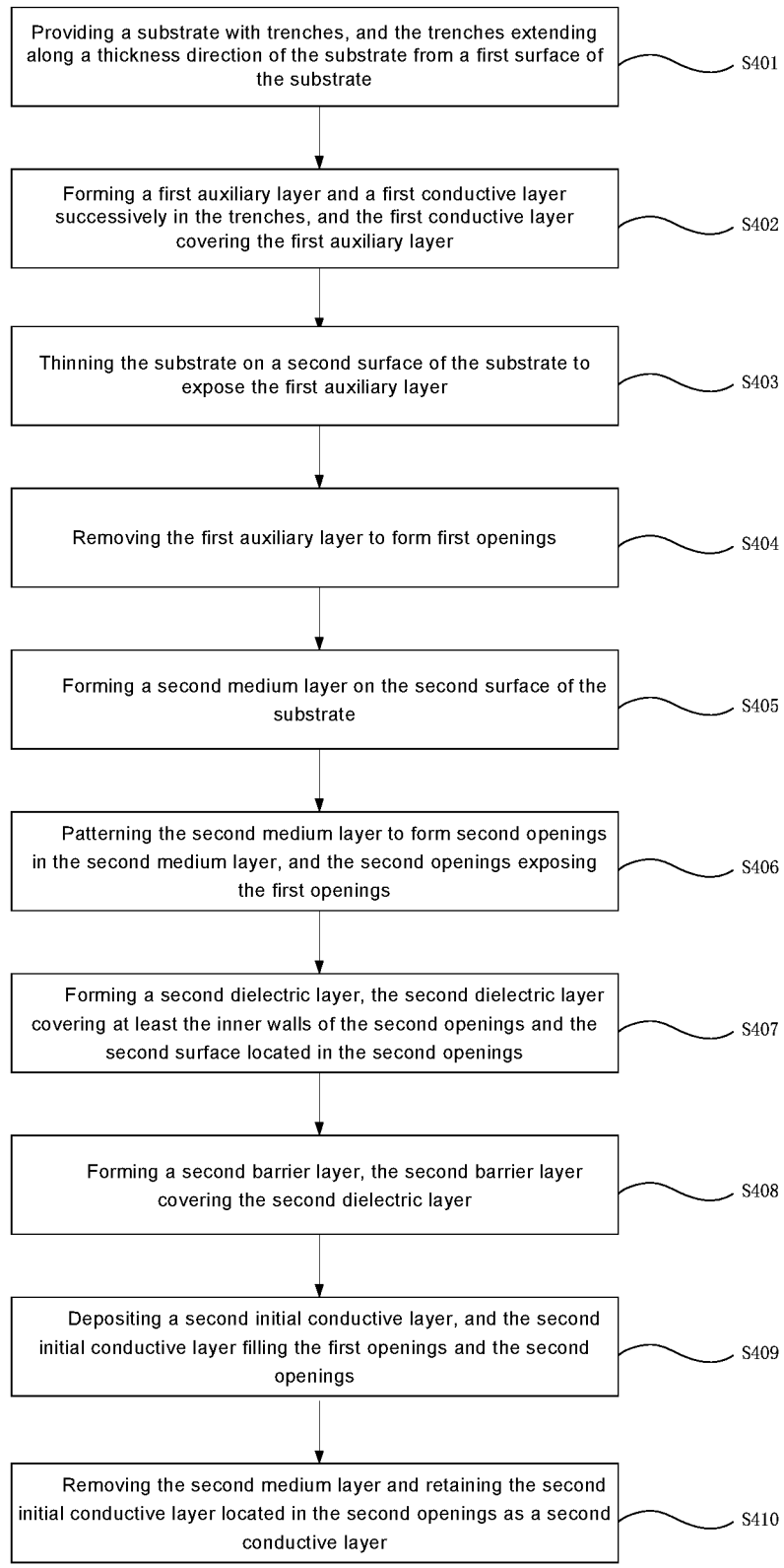
FIG. 4 is a flowchart showing a method of manufacturing a semiconductor device according to an exemplary embodiment.

In an exemplary embodiment, referring to FIG. 4, a method of manufacturing a semiconductor device is provided. The method of manufacturing a semiconductor device in this embodiment includes:

S401: providing a substrate with trenches, and the trenches extending along a thickness direction of the substrate from a first surface of the substrate;

S402: forming a first auxiliary layer and a first conductive layer successively in the trenches, and the first conductive layer covering the first auxiliary layer;

S403: thinning the substrate on a second surface of the substrate to expose the first auxiliary layer, wherein the first surface and the second surface are arranged opposite to each other;

S404: removing the first auxiliary layer to form first openings;

S405: forming a second medium layer on the second surface of the substrate;

S406: patterning the second medium layer to form second openings in the second medium layer, and the second openings exposing the first openings;

S407: forming a second dielectric layer, the second dielectric layer covering at least the inner walls of the second openings and the second surface located in the second openings;

S408: forming a second barrier layer, the second barrier layer covering the second dielectric layer;

S409: depositing a second initial conductive layer, and the second initial conductive layer filling the first openings and the second openings; and S410: removing the second medium layer and retaining the second initial conductive layer located in the second openings as a second conductive layer.

Figure 22:
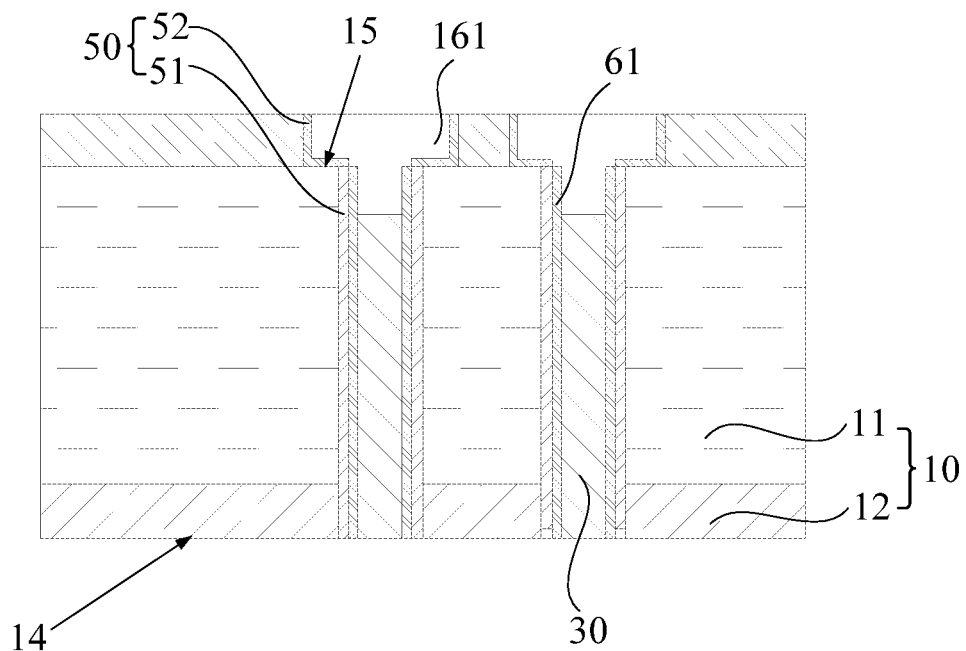
Figure 23:
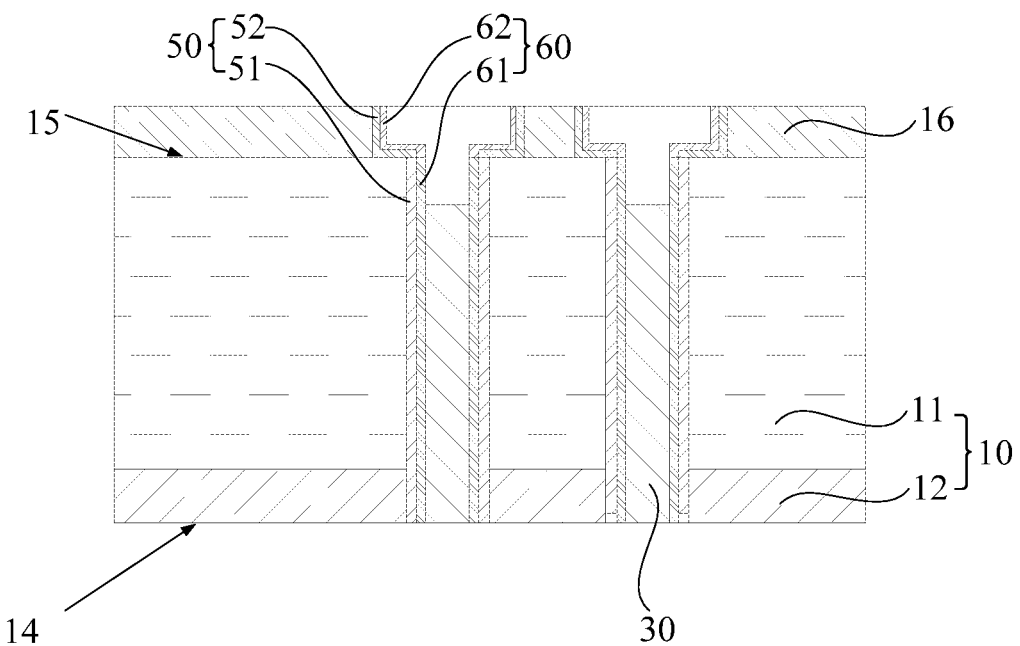

In this embodiment, the implementations of step S401 to S406, S409 and S410 are the same as the steps in the above embodiment, and will not be repeated here. In steps S407 and S408, as shown in FIG. 22 and FIG. 23, referring to FIG. 25, the second dielectric layer 52 and the second barrier layer 62 are deposited in the second openings 161 by a deposition process, and the second dielectric layer 52 covers at least the inner walls of the second openings 161 and a partial area of the second surface 15 located in the second openings 161. Then, the second barrier layer 62 is deposited by the deposition process, and the second barrier layer 62 covers the second dielectric layer 52, so as to separate the second conductive layer 41 from the substrate 10, and avoid the influence of the charge in the second conductive layer 41 on the substrate 10 during the operation of the semiconductor device.

In this embodiment, after forming the second conductive layer 41, if the material of the second conductive layer 41 is copper, the second conductive layers 41 are annealed to eliminate the stress in the second conductive layer 41.

Figure 5:
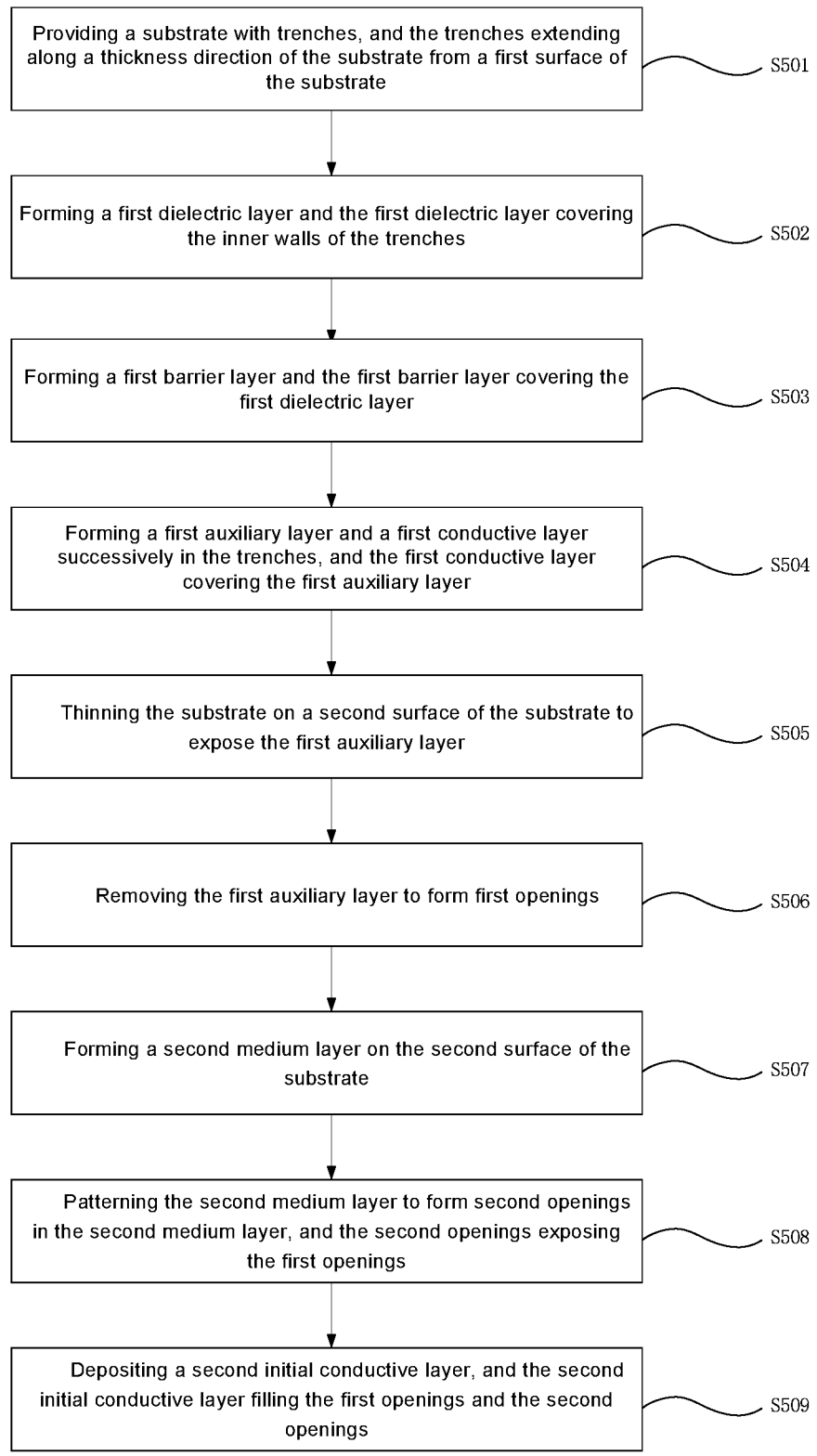
FIG. 5 is a flowchart showing a method of manufacturing a semiconductor device according to an exemplary embodiment.

In an exemplary embodiment, referring to FIG. 5, a method of manufacturing a semiconductor device is provided. The method of manufacturing a semiconductor device in this embodiment includes:

S501: providing a substrate with trenches, and the trenches extending along a thickness direction of the substrate from a first surface of the substrate;

S502: forming a first dielectric layer and the first dielectric layer covering the inner walls of the trenches;

S503: forming a first barrier layer and the first barrier layer covering the first dielectric layer;

S504: forming a first auxiliary layer and a first conductive layer successively in the trenches, and the first conductive layer covering the first auxiliary layer;

S505: thinning the substrate on a second surface of the substrate to expose the first auxiliary layer, wherein the first surface and the second surface are arranged opposite to each other;

S506: removing the first auxiliary layer to form first openings;

S507: forming a second medium layer on the second surface of the substrate;

S508: patterning the second medium layer to form second openings in the second medium layer, and the second openings exposing the first openings; and S509: depositing a second initial conductive layer, and the second initial conductive layer filling the first openings and the second openings.

Figure 10:
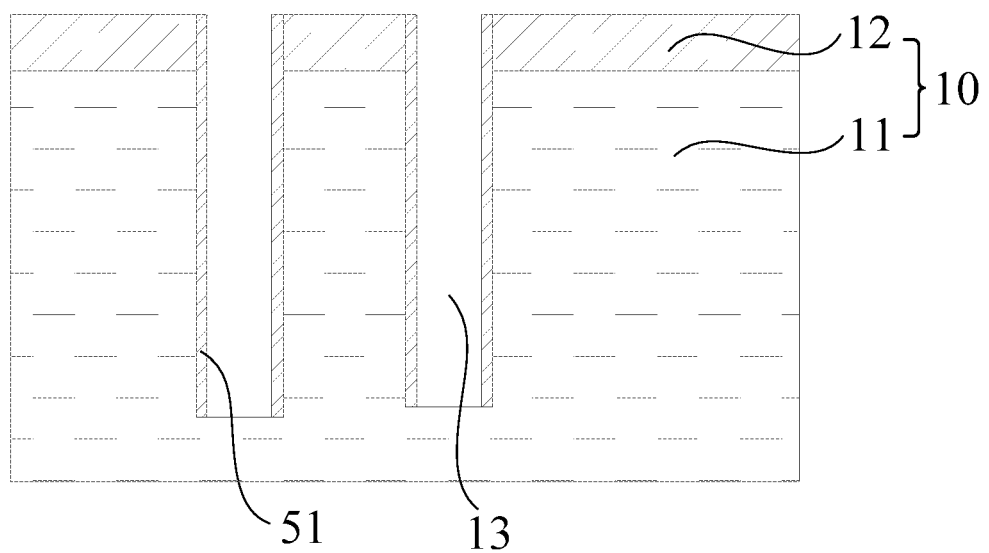
Figure 11:
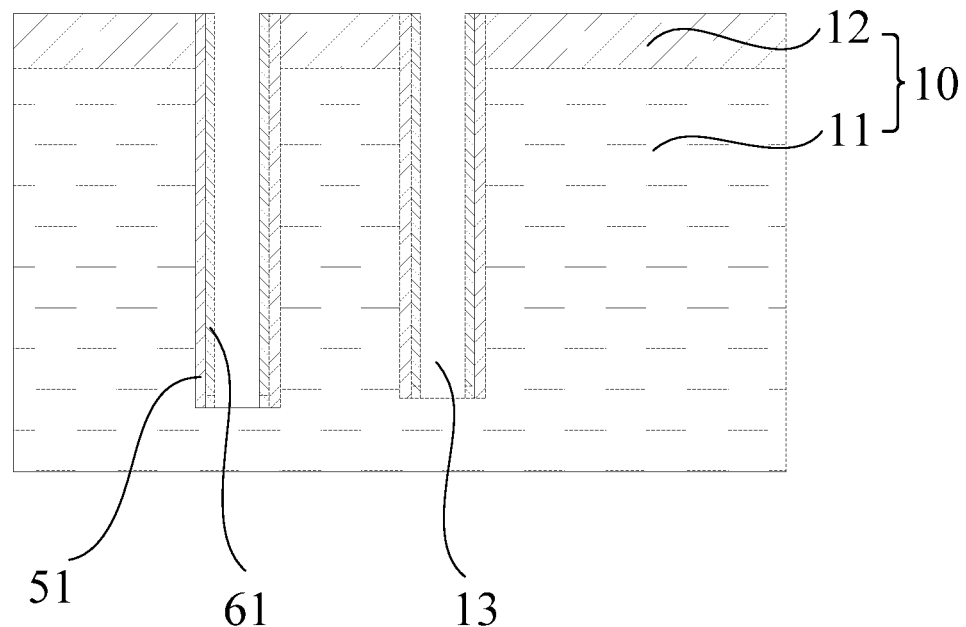

In this embodiment, the implementations of step S501 and S504 to S509 are the same as the steps in the above embodiment, and will not be repeated here. In steps S502 and S503, as shown in FIGS. 10 and 11, a first dielectric layer 51 and a first barrier layer 61 are formed on side walls of the trenches 13 by a deposition process. The first dielectric layer 51 covers the inner walls of the trenches 13, and the first barrier layer 61 covers the first dielectric layer 51, so that the first conductive layer 30, the first auxiliary layer 20 and the inner walls of the trenches 13 are separated by the first dielectric layer 51 and the first barrier layer 61. The material of the first dielectric layer 51 is silicon nitride, and the material of the first barrier layer 61 is titanium nitride.

In addition, referring to FIGS. 12 and 13, the first conductive layer 30 and the first auxiliary layer 20 in this embodiment are not directly connected with the inner walls of the trenches 13. The first dielectric layer 51 and the first barrier layer 61 are provided between the first conductive layer 30, the first auxiliary layer 20 and the side walls of the trenches 13, so the side walls of the first conductive layer 30 and the first auxiliary layer 20 are in contact with and connected with the first barrier layer 61.

In this embodiment, by providing the first dielectric layer 51 and the first barrier layer 61, on the one hand, the first dielectric layer 51 plays an insulating role to prevent interference between the first conductive layer 30, the second conductive layer 41 and the active devices on the substrate 10; on the other hand, the first barrier layer 61 can provide buffer barrier for the substrate 10 during grinding to reduce the probability of cracks in the silicon layer, prevent copper from contaminating the surface or cracks of the nearby silicon layer, and further improve the yield of TSV production.

Figure 6:
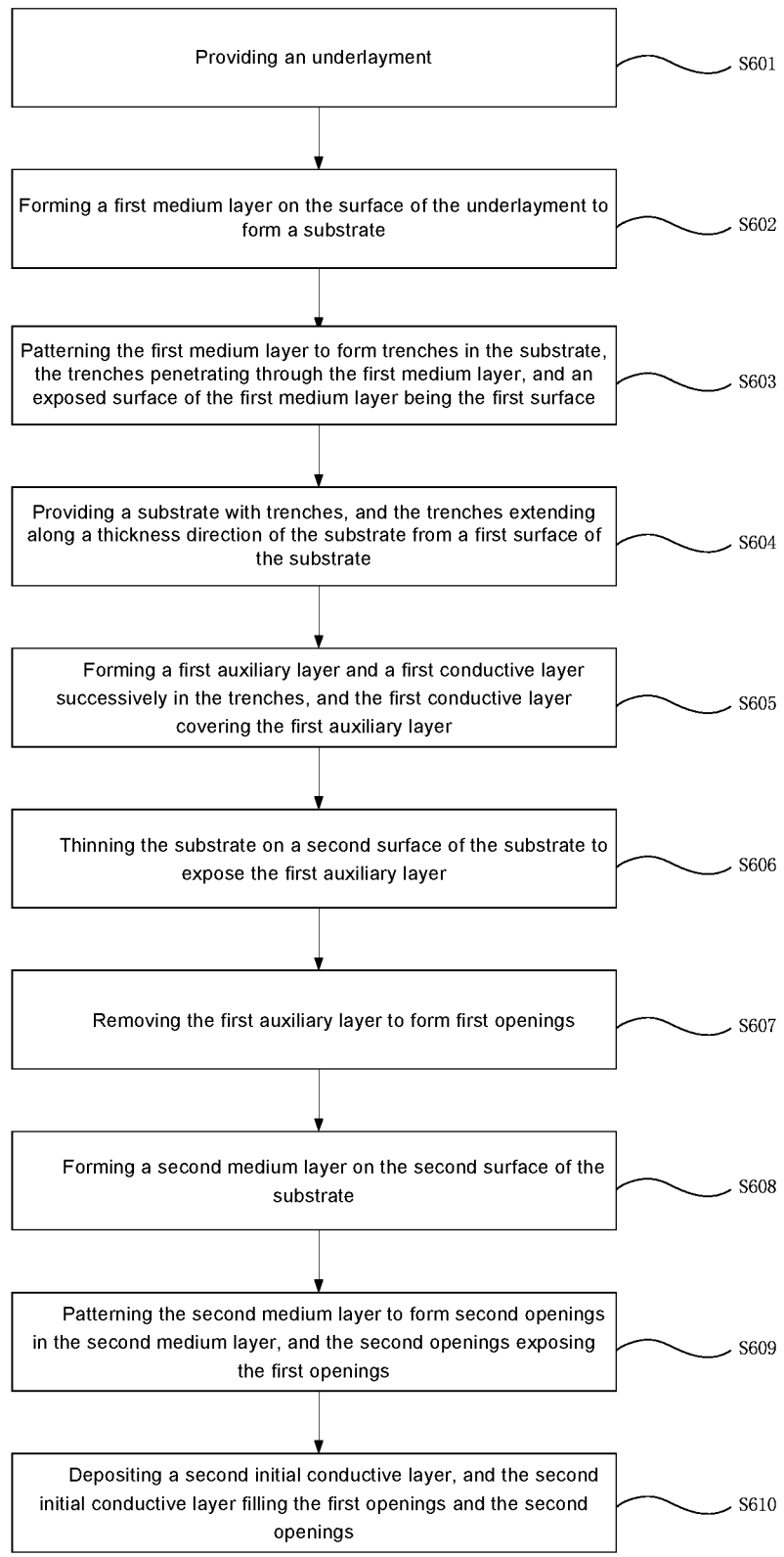
FIG. 6 is a flowchart showing a method of manufacturing a semiconductor device according to an exemplary embodiment.

In an exemplary embodiment, referring to FIG. 6, a method of manufacturing a semiconductor device is provided. The method of manufacturing a semiconductor device in this embodiment includes:

S601: providing an underlayment;

S602: forming a first medium layer on the surface of the underlayment to form a substrate;

S603: patterning the first medium layer to form trenches in the substrate, the trenches penetrating through the first medium layer, and an exposed surface of the first medium layer being the first surface;

S604: providing a substrate with trenches, and the trenches extending along a thickness direction of the substrate from a first surface of the substrate;

S605: forming a first auxiliary layer and a first conductive layer successively in the trenches, and the first conductive layer covering the first auxiliary layer;

S606: thinning the substrate on a second surface of the substrate to expose the first auxiliary layer, wherein the first surface and the second surface are arranged opposite to each other;

S607: removing the first auxiliary layer to form first openings;

S608: forming a second medium layer on the second surface of the substrate;

S609: patterning the second medium layer to form second openings in the second medium layer, and the second openings exposing the first openings; and S610: depositing a second initial conductive layer, and the second initial conductive layer filling the first openings and the second openings.

Figure 7:
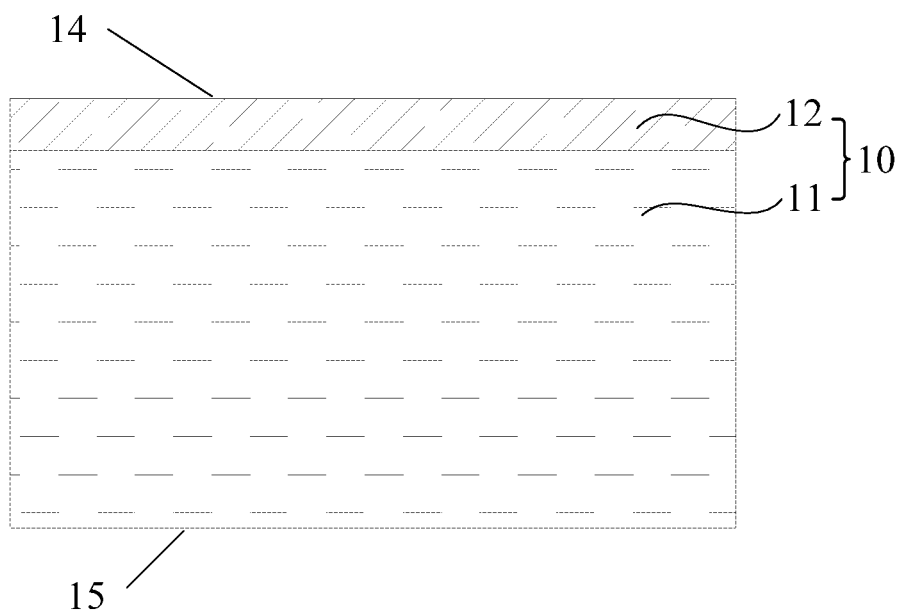
FIGS. 7 to 25 are schematic diagrams of the structures involved in each step of processing a semiconductor device by a method of manufacturing a semiconductor device.
Figure 8:
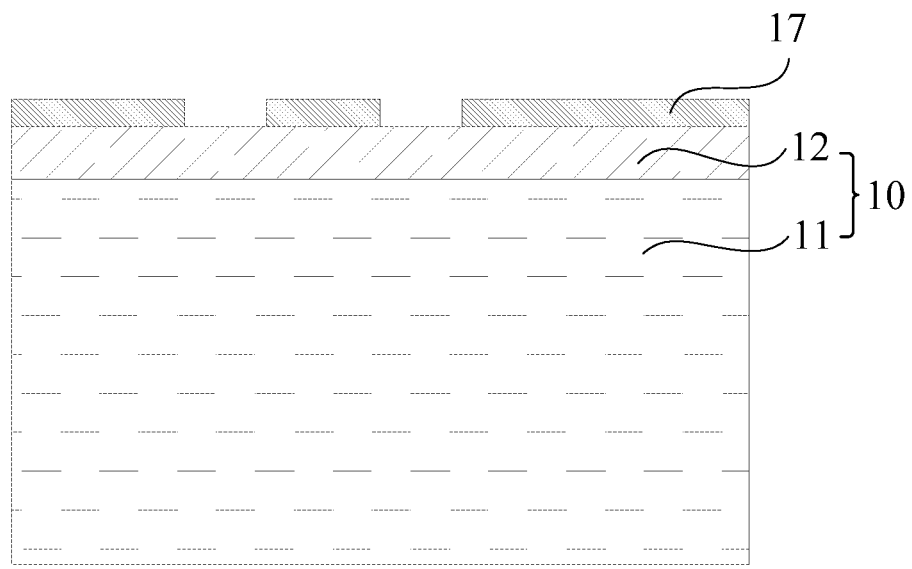

The implementations of Steps S604 to S610 are the same as the steps in the above embodiment, and will not be repeated here. As shown in FIGS. 7 and 8, and referring to FIG. 9, in steps S601, S602 and S603, an underlayment 11 is first provided, the material of the underlayment 11 may be silicon, a first medium layer 12 is formed on the surface of the underlayment 11, and the underlayment 11 and the first medium layer 12 are the substrate 10. The first medium layer 12 is patterned and trenches 13 are formed in the substrate 10 by an etching process. The surface of the first medium layer 12 on the side away from the underlayment 11 is the first surface 14, and the surface of the underlayment 11 on the side away from the first medium layer 12 is the second surface 15.

As shown in FIG. 8, when patterning the first medium layer 12, a mask layer 17 is formed on the first medium layer 12. Geometric patterns are formed on the mask layer 17 by exposure and development, and then the patterns on the mask layer 17 are transferred to the substrate 10 through an etching process to form trenches 13. The material of the first medium layer 12 is different from the material of the second medium layer 16.

In this embodiment, under the same etching conditions, the material of the first auxiliary layer 20 is silicon dioxide or silicon nitride or metal with low ductility, and the material of the substrate 10 is silicon. Therefore, the etching rate of the first auxiliary layer 20 is higher than the etching rate of the substrate 10, so that when the first auxiliary layer 20 is removed by the etching process in step S104, the etching rate of the first auxiliary layer 20 is faster than the etching rate of the substrate 10 to ensure that the amount of etching on the substrate 10 is minimized when the first auxiliary layer 20 is removed.

The first auxiliary layer 20 has a high selection ratio to the substrate 10, that is, the etching rate of the first auxiliary layer 20 is higher than the etching rate of the substrate 10. For example, the ratio of the etching rate of the first auxiliary layer 20 to the etching rate of the substrate 10 is 100 or 80, etc.

High selection ratio: selection ratio refers to how much faster the etching rate of a material is compared to another material under the same etching conditions. It is defined as the ratio of the etching rate of the etched material to the etching rate of another material. High selection ratio means that only the layer of material you want to etch is removed. An etching process of high selection ratio does not etch the material of the underlying layer (the etching stops when the etching reaches the appropriate depth) and the protected photoresist is not etched.

In addition, in the present embodiment, the ductility of the material of the first auxiliary layer 20 is less than that of the material of the first conductive layers 30. For example, the material of the first auxiliary layer 20 is silicon dioxide or silicon nitride or a metal material with low ductility. At this time, in step S103, the material of the substrate 10 close to the second surface 15 and part of the first auxiliary layer 20 are ground off at the same time. Since the material of the first auxiliary layer 20 is the material with ductility close to silicon, such as silicon dioxide or silicon nitride, etc., the probability of cracks on the second surface 15 of the substrate 10 is reduced, and there is no metal contamination on the second surface 15 and cracks of the substrate 10. If the first auxiliary layer 20 is made of a metal with ductility less than that of the first conductive layer 30, the probability of contamination caused by the metal contained in the first auxiliary layer 20 entering the surface or cracks of the silicon layer is reduced to a certain extent.

The method of manufacturing a semiconductor device provided in the present disclosure, by successively depositing the first auxiliary layer and the first conductive layer in the trenches, in the process of thinning the substrate by the grinding process to make the trenches become through holes penetrating both sides of the substrate, the second surface of the substrate and the first auxiliary layer in the trenches are ground at the same time, and the first conductive layer is not ground. Therefore, the metal in the first conductive layer (for example, copper) will not contaminate the second surface or cracks of the substrate. At the same time, the material of the first auxiliary layer adopts materials with ductility close to silicon such as silicon dioxide or silicon nitride. Therefore, the probability of cracks on the second surface of the substrate is reduced, and there is no metal contamination on the second surface and cracks of the substrate, which can further improve the yield of TSV production.

Figure 26:
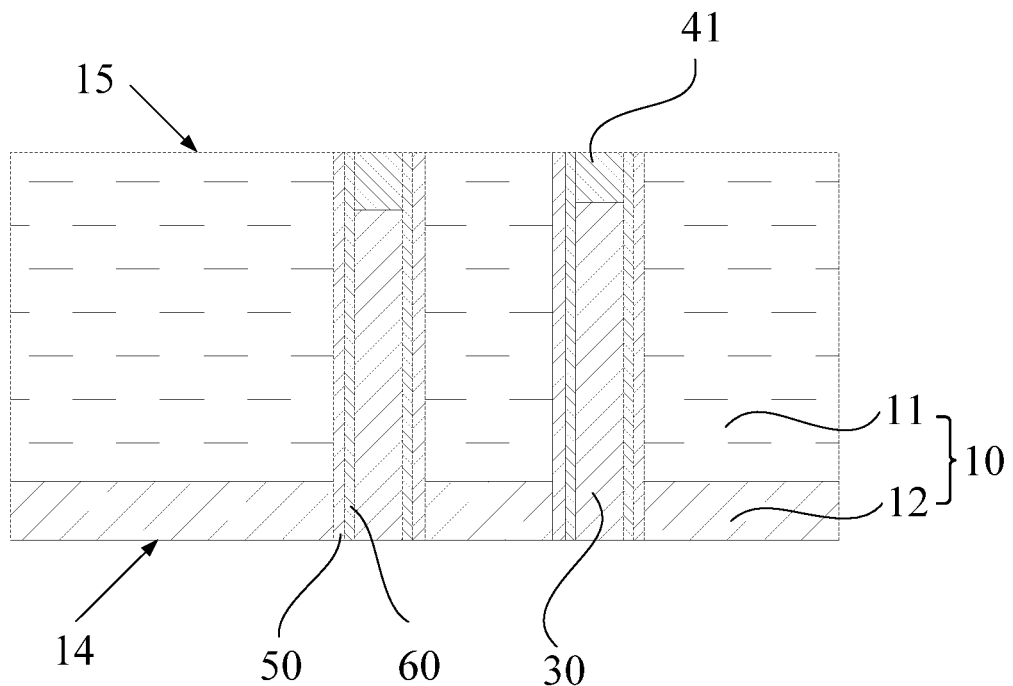
FIG. 26 is a schematic structural diagram showing a semiconductor device according to an exemplary embodiment.
Figure 27:
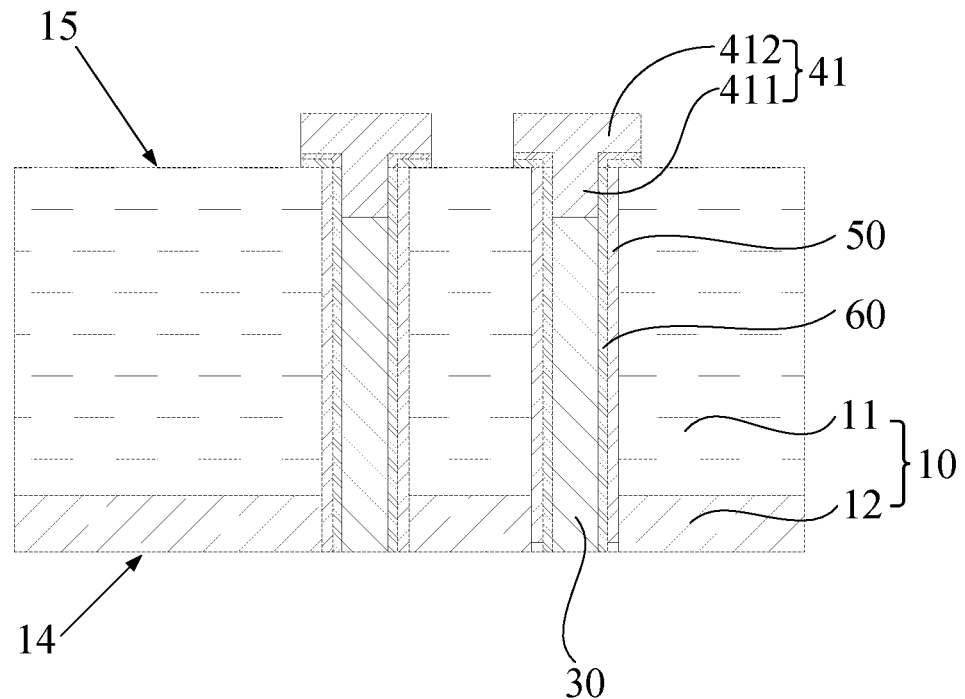
FIG. 27 is a schematic structural diagram showing a semiconductor device according to an exemplary embodiment.

The technical solution of the second aspect of the present disclosure provides a semiconductor device. According to an exemplary embodiment, as shown in FIG. 26 and FIG. 27, referring to FIG. 28, the semiconductor device includes a substrate 10, the substrate 10 has a first surface 14 and a second surface 15, and the first surface 14 and the second surface 15 are arranged opposite. At least one through hole 18 is arranged on the substrate 10 and penetrates the substrate 10 along the thickness direction of the substrate 10. The semiconductor device also includes a first conductive layer 30 and a second conductive layer 41, which are filled in the through holes 18 and filled with the through holes 18. The first conductive layer 30 and the second conductive layer 41 in the same through hole 18 are connected, wherein the top surface of the first conductive layer 30 is flush with the first surface 14 of the substrate 10, and the top surface of the second conductive layer 41 is flush with the second surface 15 of the substrate 10. In this embodiment, the first conductive layer 30 and the second conductive layer 41 form the TSV structure of the semiconductor device to realize the interconnection between chips with the shortest distance and the smallest spacing, so as to achieve better electrical performance.

Figure 28:
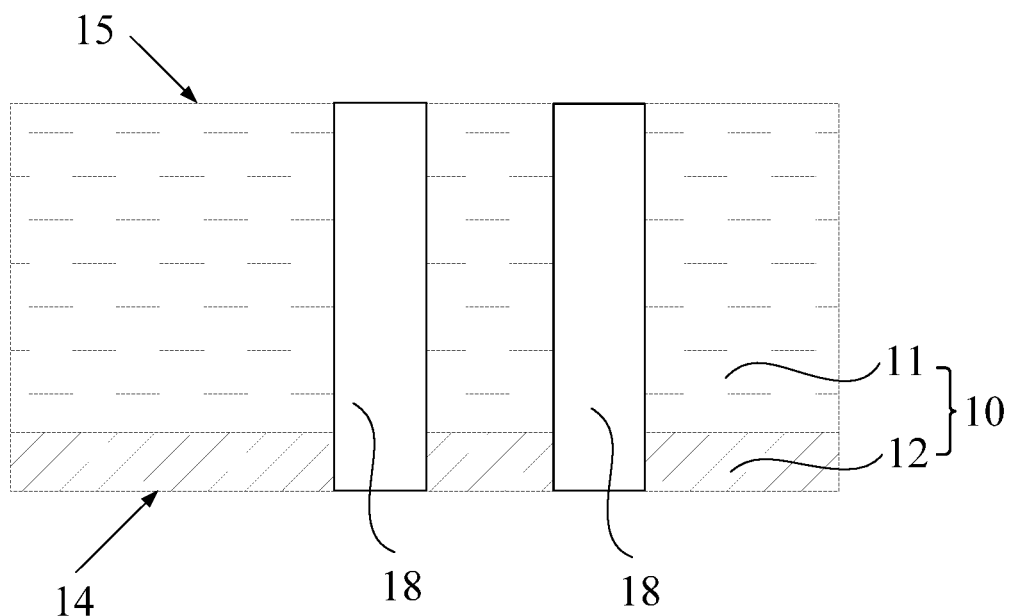
FIG. 28 is a schematic structural diagram showing a semiconductor device according to an exemplary embodiment.

In an exemplary embodiment, as shown in FIGS. 26 and 28, the semiconductor device further includes a dielectric layer 50 covering the inner walls of the through holes 18, the through holes 18, and a barrier layer 60 covering the inner walls of the dielectric layer 50. When the cross sections of the through holes 18 are circular, along the radial direction of the through holes 18, the first conductive layer 30 and the second conductive layer 41 are located on the inner side of the barrier layer 60. The dielectric layer 50 and the barrier layer 60 separate the first conductive layer 30 and the second conductive layer 41 from the substrate 10 to avoid the interference of the charges in the first conductive layer 30 and the second conductive layer 41 to the active devices on the substrate 10.

In this embodiment, as shown in FIG. 25, the second conductive layer 41 includes a first part 411 and a second part 412, and the top surface of the first part 411 is flush with the second surface 15 of the substrate 10. The second part 412 is located on the second surface 15, and the surface of the second parts 412 connected with the first part 411 covers parts of the second surface 15, so that the second part 412 of the second conductive layer 41 protrudes from the second surface 15 of the substrate 10 to form a bump structure for electrical connection between different semiconductor devices. The first part 411 and the second part 412 are connected as a whole.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present disclosure.

In this specification, the schematic descriptions of the above terms do not necessarily refer to the same embodiment or example. Moreover, the described specific features, structures, materials or characteristics can be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL PRACTICABILITY

The method of manufacturing a semiconductor device and a semiconductor device provided by the embodiment of the present disclosure can effectively avoid the material of the first auxiliary layer contaminating the surface or cracks of the substrate and improve the yield in the process of thinning the substrate. Meanwhile, processing the semiconductor device using the method of manufacturing a semiconductor device in the present disclosure can reduce the processing steps and improve the processing efficiency.

The invention claimed is:

1. A method of manufacturing a semiconductor device, comprising:
   providing an underlayment;
   forming a first medium layer on a surface of the underlayment to form a substrate, the substrate having a first surface and a second surface, wherein the first surface and the second surface are arranged opposite to each other, an exposed surface of the first medium layer being the first surface;
   patterning the first medium layer to form trenches in the substrate, the trenches penetrating through the first medium layer, and the trenches extending along a thickness direction of the substrate from the first surface of the substrate;
   forming a first auxiliary layer and a first conductive layer successively in the trenches, and the first conductive layer covering the first auxiliary layer;
   thinning the substrate on the second surface of the substrate to expose the first auxiliary layer;
   removing the first auxiliary layer to form first openings;
   forming a second medium layer on the second surface of the substrate;
   patterning the second medium layer to form second openings in the second medium layer, and the second openings exposing the first openings; and
   depositing a second initial conductive layer, the second initial conductive layer filling the first openings and the second openings.

2. The method of manufacturing the semiconductor device according to claim 1, after depositing the second initial conductive layer, the method of manufacturing the semiconductor device further comprises:
  removing the second medium layer and the second initial conductive layer located in the second openings, and retaining the second initial conductive layer located in the first openings as a second conductive layer.

3. The method of manufacturing the semiconductor device according to claim 2, after forming the second conductive layer, the method of manufacturing the semiconductor device further comprises:
  annealing the second conductive layer.

4. The method of manufacturing the semiconductor device according to claim 1, after depositing the second initial conductive layer, the method of manufacturing the semiconductor device further comprises:
  removing the second medium layer and retaining the second initial conductive layer located in the second openings as a second conductive layer.

5. The method of manufacturing the semiconductor device according to claim 4, wherein
  a coefficient of thermal expansion of the second conductive layer is less than a coefficient of thermal expansion of the first conductive layer.

6. The method of manufacturing the semiconductor device according to claim 5, after forming the second conductive layer, the method of manufacturing the semiconductor device further comprises:
  annealing the second conductive layer.

7. The method of manufacturing the semiconductor device according to claim 4, wherein a material of the first conductive layer is the same as or different from a material of the second conductive layer.

8. The method of manufacturing the semiconductor device according to claim 7, after forming the second conductive layer, the method of manufacturing the semiconductor device further comprises:
  annealing the second conductive layer.

9. The method of manufacturing the semiconductor device according to claim 4, a width of a projection contour of each of the second openings on the substrate is greater than a width of a projection contour of each of the first openings on the substrate, before depositing the second initial conductive layer, the method of manufacturing the semiconductor device further comprises:
  forming a second dielectric layer, the second dielectric layer covering at least inner walls of the second openings and the second surface located in the second openings; and
  forming a second barrier layer, the second barrier layer covering the second dielectric layer.

10. The method of manufacturing the semiconductor device according to claim 9, after forming the second conductive layer, the method of manufacturing the semiconductor device further comprises:
  annealing the second conductive layer.

11. The method of manufacturing the semiconductor device according to claim 4, after forming the second conductive layer, the method of manufacturing the semiconductor device further comprises:
  annealing the second conductive layer.

12. The method of manufacturing the semiconductor device according to claim 1, before forming the first auxiliary layer and the first conductive layer successively in the trenches, the method of manufacturing the semiconductor device further comprises:
  forming a first dielectric layer, the first dielectric layer covering inner walls of the trenches; and
  forming a first barrier layer, the first barrier layer covering the first dielectric layer.

13. The method of manufacturing the semiconductor device according to claim 1, wherein,
  under a same etching condition, an etching rate of the first auxiliary layer is higher than an etching rate of the substrate.

14. The method of manufacturing the semiconductor device according to claim 1, wherein,
  a ductility of a material of the first auxiliary layer is less than a ductility of a material of the first conductive layer.

15. A method of manufacturing a semiconductor device, comprising:
  providing a substrate with trenches, and the trenches extending along a thickness direction of the substrate from a first surface of the substrate;
  forming a first dielectric layer, the first dielectric layer covering inner walls of the trenches;
  forming a first barrier layer, the first barrier layer covering the first dielectric layer;
  forming a first auxiliary layer and a first conductive layer successively in the trenches, and the first conductive layer covering the first auxiliary layer;
  thinning the substrate on a second surface of the substrate to expose the first auxiliary layer, wherein the first surface and the second surface are arranged opposite to each other;
  removing the first auxiliary layer to form first openings;
  forming a second medium layer on the second surface of the substrate;
  patterning the second medium layer to form second openings in the second medium layer, and the second openings exposing the first openings; and
  depositing a second initial conductive layer, the second initial conductive layer filling the first openings and the second openings.

* * * * *